(12) United States Patent
Gauthier et al.

(10) Patent No.: US 6,842,057 B1
(45) Date of Patent: Jan. 11, 2005

(54) ANALOG STATE RECOVERY TECHNIQUE FOR DLL DESIGN

(75) Inventors: Claude R. Gauthier, Cupertino, CA (US); Aninda K. Roy, San Jose, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 10/638,805

(22) Filed: Aug. 11, 2003

(51) Int. Cl.[7] .................................................. H03L 7/06
(52) U.S. Cl. ...................... 327/158; 327/161; 327/149
(58) Field of Search ................................ 327/147, 149, 327/152, 153, 156, 158, 161

(56) References Cited

U.S. PATENT DOCUMENTS 6,018,259 A * 1/2000 Lee ............................ 327/159
6,166,990 A * 12/2000 Ooishi et al. ................ 365/233
6,510,191 B2 * 1/2003 Bockelman .................. 375/371
6,680,874 B1 * 1/2004 Harrison ...................... 365/233

* cited by examiner

Primary Examiner—Timothy P. Callahan
Assistant Examiner—Cassandra Cox
(74) Attorney, Agent, or Firm—Osha & May L.L.P.

(57) ABSTRACT

A method and apparatus stores a voltage potential generated by a delay locked loop in order to reduce the time required for the delay locked loop to recover from a lost clock state. A clock path is arranged to carry a clock signal. The delay locked loop operatively connects to the clock path where the delay locked loop is arranged to generate a voltage potential dependent on a phase difference between the clock signal and a delayed clock signal output of the delay locked loop. An analog state storage apparatus operatively connects to the delay locked loop and is arranged to store the voltage potential. Also, the analog state storage apparatus is arranged to output the stored voltage potential to the delay locked loop in response to a loss of at least one of the clock signal and the delayed clock signal.

22 Claims, 5 Drawing Sheets

ANALOG STATE RECOVERY TECHNIQUE FOR DLL DESIGN

BACKGROUND OF INVENTION

As the frequencies of modern computers continue to increase, the need to rapidly transmit data between chip interfaces also increases. To accurately receive data, a clock signal is often sent to help recover the data. The clock signal determines when the data should be sampled or latched by a receiver circuit.

The clock signal may transition at the beginning of the time the data is valid. The receiver circuit, however, may require that the clock signal transition during the middle of the time the data is valid. Also, the transmission of the clock signal may degrade as it travels from its transmission point. In both circumstances, a delay locked loop, or "DLL," may be used to regenerate a copy of the clock signal at a fixed phase shift with respect to the original clock signal.

Figure 1:
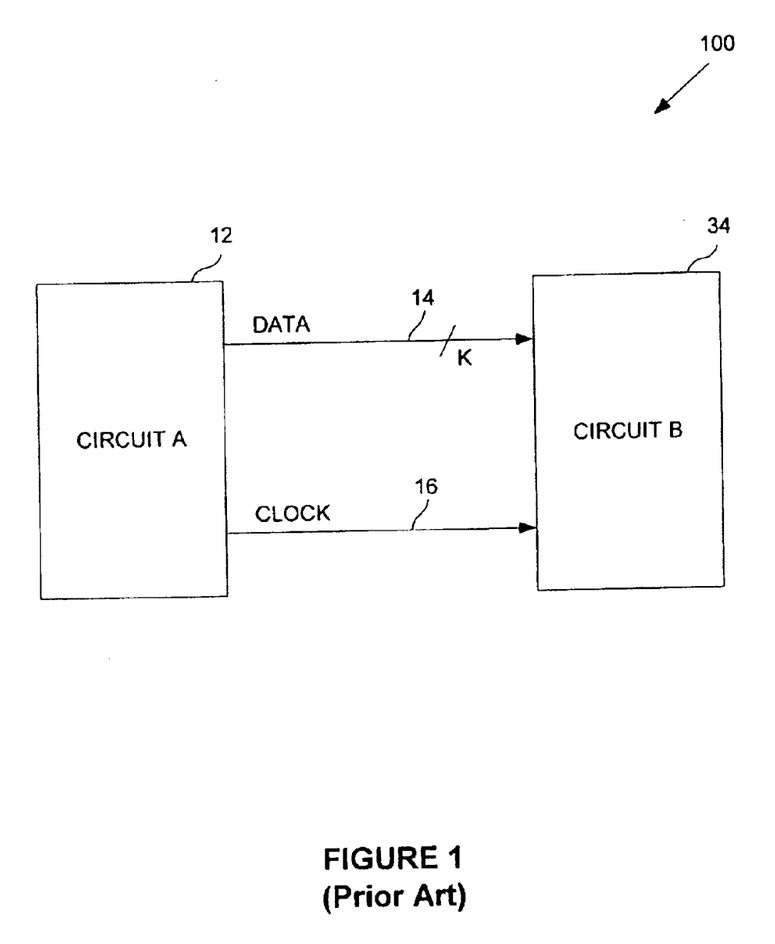
FIG. 1 illustrates a block diagram of a typical computer system component.

FIG. 1 shows a section of a typical computer system component (100). Data (14) that is K bits wide is transmitted from circuit A (12) to circuit B (34) (also referred to as the "receiver circuit"). To aid in the recovery of the transmitted data, a clock signal (16) is also transmitted with the data (14). The circuits (12, 34) could also have a path to transmit data from circuit B (34) to circuit A (12) along with an additional clock signal (not shown). The clock signal (16) may transition from one state to another at the beginning of data transmission. Circuit B (34) requires a clock signal temporally located some time after the beginning of the valid data. Furthermore, the clock signal (16) may have degraded during transmission.

A DLL has the ability to regenerate the clock signal (16) to a valid state and to create a phase shifted version of the clock signal (16) to be used by other circuits. For example, the receiver circuit (34) may use the phase shifted version of the clock signal (16) as the receiver circuit's sampling signal. The receiver circuit's sampling signal determines when the input to the receiver circuit (34) should be sampled. The performance of a DLL is critical and must maintain a proper reference of time on the CPU, or generically, an integrated circuit.

Figure 2:
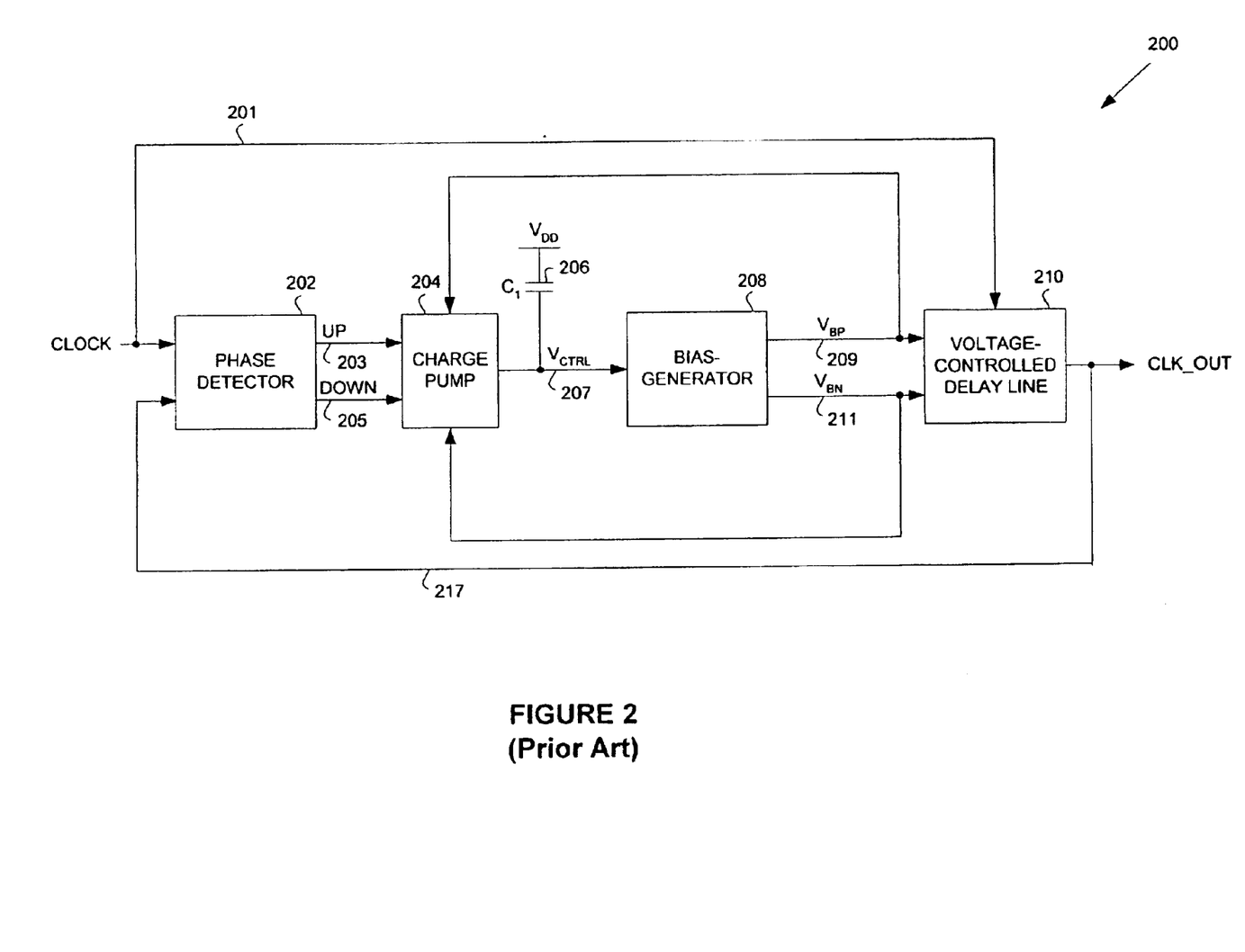
FIG. 2 illustrates a block diagram of a prior art delay locked loop.

FIG. 2 shows a block diagram of a typical DLL (200). Clock signal (201) is input to the DLL (200) to create a phased (i.e., delayed) output. Particularly, clock signal (201) is input to a voltage-controlled delay line (210) and to a phase detector (202) of the DLL (200). The phase detector (202) measures whether a phase difference between the clock signal (201) and an output signal, clk_out (217), of the voltage-controlled delay line (210) has a desired amount of delay. Depending on the phase difference, the phase detector (202) produces signals that control a charge pump (204). The phase detector (202) uses an UP signal (203) and DOWN signal (205) to adjust the charge pump (204) to increase or decrease its output current. To ensure that the charge pump (204) maintains some nominal current output, the charge pump (204) is internally biased. The internal biasing of the charge pump (204) is dependent on bias signals, $V_{BP}$ (209) and $V_{BN}$ (211), generated from a bias generator (208) (discussed below). The UP and DOWN signals (203, 205) adjust the current output of the charge pump (204) with respect to the nominal current set by the bias signals (209, 211).

The charge pump (204) adds or removes charge from a capacitor $C_1$ (206), which, in turn, changes a voltage potential at the input of the bias-generator (208). The capacitor (206) is connected between a power supply, $V_{DD}$, and a control signal, $V_{CTRL}$ (207). The bias-generator (208) produces the bias signals (209, 211) in response to the control signal (207), which, in turn, controls the delay of the voltage-controlled delay line (210) and, as mentioned above, maintains a nominal current output from the charge pump (204).

In FIG. 2, the voltage-controlled delay line (210) may be implemented using current starved elements. In other words, the delays of the voltage-controlled delay line (210) may be controlled by modifying the amount of current available for charging and discharging capacitances within the voltage-controlled, delay line (210). The linearity of a voltage controlled delay line's characteristics determines the stable range of frequencies over which the DLL (200) can operate. The output signal (217) of the voltage-controlled delay line (210) represents a phase delayed copy of clock signal (201) that is then used by other circuits.

Still referring to FIG. 2, the negative feedback created by the output signal (217) in the DLL (200) adjusts the delay through the voltage-controlled delay line (210). The phase detector (202) integrates the phase error that results between the clock signal (201) and the output signal (217). The voltage-controlled delay line (210) delays the output signal (217) by a fixed amount of time such that a desired delay between the clock signal (201) and the output signal (217) is maintained.

Accordingly, proper operation of the receiver circuit (34 in FIG. 1) depends on the DLL (200) maintaining a constant phase delay between the clock signal (201) and the output signal (217).

SUMMARY OF INVENTION

According to one aspect of one or more embodiments of the present invention, the present invention relates to an integrated circuit comprising a clock path arranged to carry a clock signal; a power supply path arranged to receive power from a power supply; a delay locked loop operatively connected to the power supply path and the clock path where the delay locked loop is arranged to generate a voltage potential dependent on a phase difference between the clock signal and a delayed clock signal output of the delay locked loop; and an analog state storage apparatus operatively connected to the delay locked loop where the analog state storage apparatus is arranged to store the voltage potential and where the analog state storage apparatus is arranged to output the stored voltage potential to the delay locked loop in response to a loss of any one of the clock signal and the delayed clock signal.

According to one aspect of one or more embodiments of the present invention, the present invention relates to a method for controlling a delay locked loop comprising generating a delayed clock signal; comparing the delayed clock signal to an input clock signal; generating a voltage potential dependent on the comparing; storing the voltage potential; and operatively using the stored voltage potential to generate the delayed clock signal in response to a loss of any one of the input clock signal and the delayed clock signal.

According to one aspect of one or more embodiments of the present invention, the present invention relates to an integrated circuit comprising means for generating a delayed clock signal; means for comparing the delayed clock signal to an input clock signal; means for generating a voltage potential dependent on the means for comparing; means for storing the voltage potential; and means for selectively disconnecting the generated voltage potential from the stored voltage potential in response to a loss of any one of the input clock signal and the delayed clock signal.

Other aspects and advantages of the invention will be apparent from the following description and the appended claims.

DETAILED DESCRIPTION

Exemplary embodiments of the invention will be described with reference to the accompanying drawings. Like items in the drawings are shown with the same reference numbers.

During steady-state operation, the DLL (200) maintains a desired amount of delay for the voltage-controlled delay line (210). However, a lost clock state may occur in which any one of the clock signal (201) and output signal (217) are lost. For example, the lost clock state may occur during transient disturbances in which any one of the clock signal (201) and output signal (217) may be lost for a limited number of cycles. Further, any one of the clock signal (201) and output signal (217) may be lost due to noise and/or loading conditions such that a valid clock signal is not recognized. Also, a system may be designed such that a clock signal is intermittently transmitted. Following a lost clock state, the DLL (200) must "relock" to provide the desired amount of delay. The duration of the relock typically is an undesirably long time.

In FIG. 2, the DLL (200) determines the amount of delay of the voltage-controlled delay line (210) dependent on a voltage potential maintained by the capacitor (206). Charge on the capacitor (206) is determined by the charge pump (204), which is controlled by the phase detector (202). During a lost clock state, the phase detector (202) and/or charge pump (204) will alter the charge on the capacitor (206). Accordingly, the delay generated by the voltage-controlled delay line (210) must be readjusted dependent on the phase error measured by the phase detector (202). The duration of the readjustment of the delay may be an undesirably long time.

The present invention relates to a method and apparatus that stores a voltage potential generated by a delay locked loop to reduce the time required for the delay locked loop to recover from a lost clock state.

Figure 3:
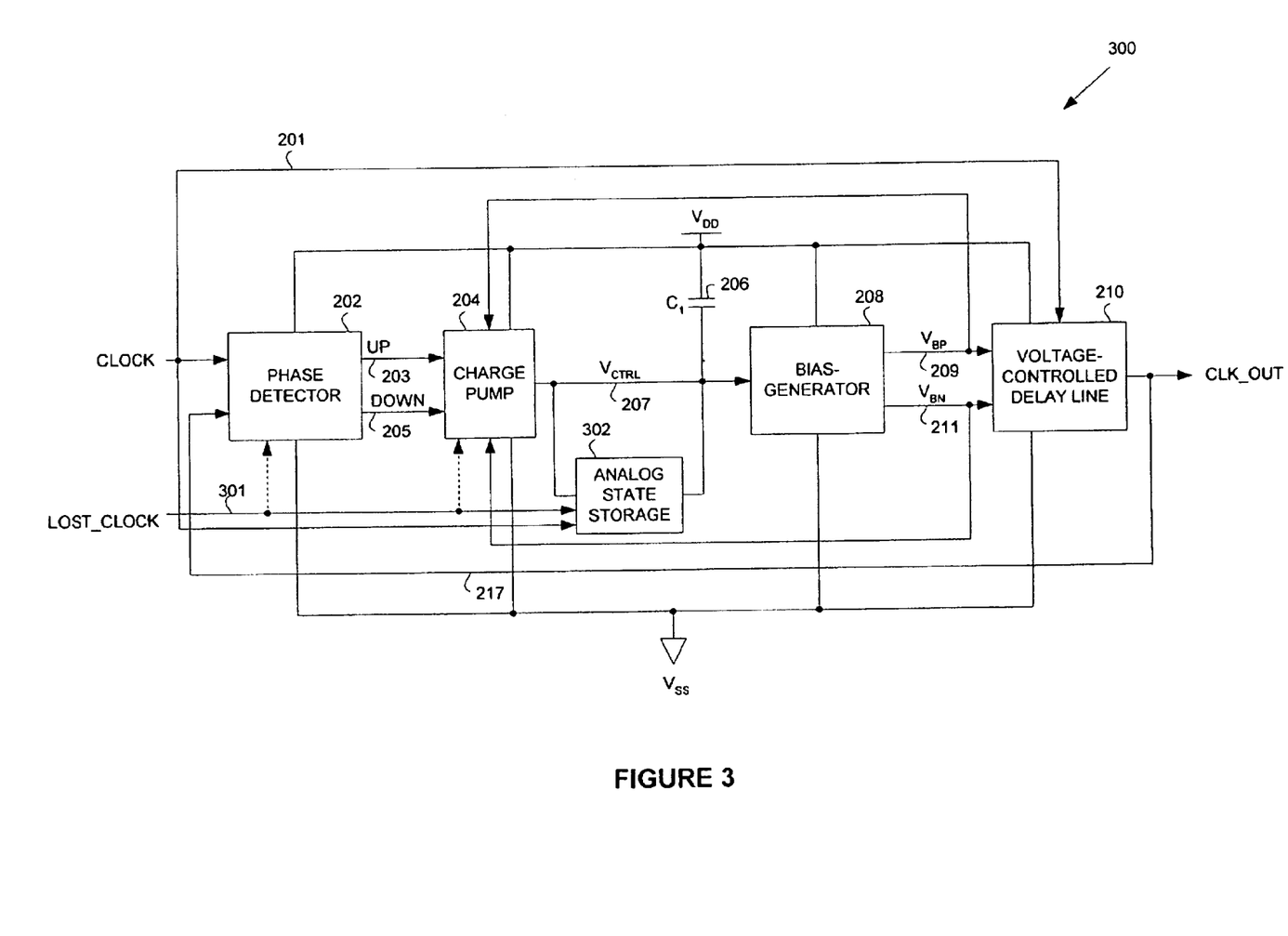
FIG. 3 illustrates a block diagram of a delay locked loop with an analog state storage apparatus in accordance with an embodiment of the present invention.

FIG. 3 illustrates a block diagram of an exemplary delay locked loop (300) with an exemplary analog state storage apparatus (302) in accordance with an embodiment of the present invention. In FIG. 3, an analog state storage apparatus (302) is operatively connected to the control signal, $V_{CTRL}$ (207). During steady-state operation of the DLL (300), the analog state storage apparatus (302) continuously stores a voltage potential dependent on the voltage potential generated on the control signal (207). During a lost clock state, as indicated by a lost clock signal on the lost_clock path (301), the stored voltage potential of the analog state storage apparatus (302) is selectively disconnected from the voltage potential generated on the control signal (207). Accordingly, the stored voltage potential of the analog state storage apparatus (302) is representative of the voltage potential on the control signal (207) before the lost clock state.

The analog state storage apparatus (302) may provide a voltage potential onto the control signal (207) during the lost clock state so that the DLL (300) does not take an undesirably long time to relock. Further more, immediately following an end of the lost clock state, as indicated by a de-assertion of the lost clock signal on the lost_clock path (301), the analog state storage apparatus (302) may continue to provide a voltage potential onto the control signal (207) dependent on the stored voltage potential of the analog state storage apparatus (302). The analog state storage apparatus (302) may continue to depend on the stored voltage potential following the de-assertion of the lost clock signal on the lost_clock path (301) for a fixed time duration. The fixed time duration may be dependent on a number of clock cycles of the clock signal (201). The fixed time duration may be dependent on a temporal delay circuit.

One of ordinary skill in the art having benefit of this disclosure will understand that in one or more embodiments the fixed time duration may be determined by counting a number of clock cycles. Furthermore, the fixed time duration may be dependent on a circuit that generates clock cycles, for example, a ring oscillator. Also, the fixed time duration may be dependent on a circuit that generates the temporal delay using a resistor and capacitor delay circuit. One of ordinary skill in the art will understand that a wide variety of fixed time duration means are currently known and the fixed time duration means is not limited to the examples above.

One of ordinary skill in the art having benefit of this disclosure will understand that in one or more embodiments the DLL (300) may not require any time to relock after a lost clock state, as the voltage potential on the control signal (207) is maintained by the analog state storage apparatus (302) during the lost clock state. Further, during a lost clock state, the analog state storage apparatus (302) may drive the voltage potential on the control signal (207) to a desired voltage potential regardless of voltage changes attempted by the charge pump (204). Furthermore, in one or more embodiments the lost clock signal on the lost_clock path (301) may be connected to the phase detector (202) and/or the charge pump (204) such that no attempts are made to alter the voltage potential on the control signal (207). Also, the phase detector (202) and/or the charge pump (204) may be designed such that no attempts are made to alter the voltage potential on the control signal (207) during a lost clock state regardless of a lost clock signal. Accordingly, in one or more embodiments the lost_clock path (301) may not be connected to the phase detector (202) and/or the charge pump (204).

Figure 4:
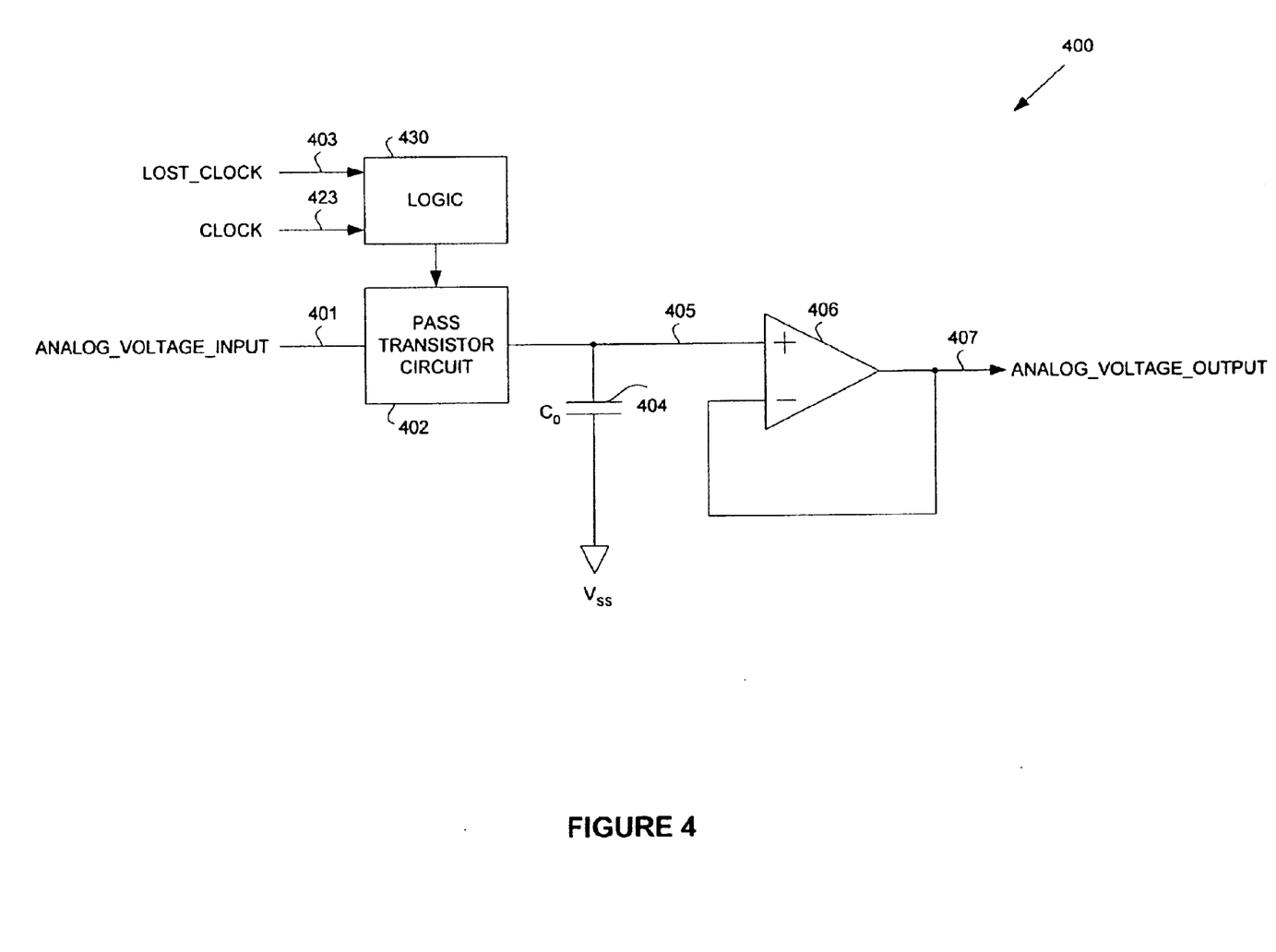
FIG. 4 illustrates a schematic diagram of an analog state storage apparatus in accordance with an embodiment of the present invention.

FIG. 4 illustrates a schematic diagram of an exemplary analog state storage apparatus (400) in accordance with an embodiment of the present invention. The analog state storage apparatus (400) may be representative of the analog state storage apparatus (302) in FIG. 3. The analog state storage apparatus (400) provides a stored voltage potential during a lost clock state so that a DLL may not lose a lock or desired phase difference between an input clock signal and an output clock signal.

In FIG. 4, a voltage potential on a voltage_input path (401) is input to a pass transistor circuit (402). The voltage_input path (401) may be representative of the control signal (207) in FIG. 3. The pass transistor circuit (402) controls a current flow between the voltage potential on the voltage_input path (401) and an output of the pass transistor circuit (405). During steady state operation, as indicated by a lost clock signal on a lost_clock path (403), the pass transistor circuit (402) allows the voltage potential on the voltage_input path (401) to connect to the output of the pass transistor circuit (405). Accordingly, a capacitor $C_0$ (404) stores a voltage potential representative of the voltage potential on the voltage_input path (401).

An amplifier (406), arranged as a unity gain amplifier, buffers the stored voltage potential on the capacitor $C_0$ (404). An output (labeled "analog_voltage_output" in FIG. 4) (407) of the amplifier (406) is operatively connected to a DLL. Accordingly, the analog state storage apparatus (400) provides a voltage potential to the DLL equivalent to the voltage potential on the voltage_input path (401).

During a lost clock state, as indicated by a lost clock signal on a lost_clock path (403), the pass transistor circuit (402) selectively disconnects the voltage potential on the voltage_input path (401) and an output of the pass transistor circuit (405). Accordingly, the voltage potential stored on the capacitor $C_0$ (404) is not altered by the voltage potential on the voltage_input path (401). The output (407) of the amplifier (406) provides a voltage potential to the DLL equivalent to the voltage potential stored on the capacitor $C_0$ (404).

Because the analog state storage apparatus (400) provides the stored voltage potential during the lost clock state, the DLL to which the analog state storage apparatus (400) is operatively connected may require little or no time to relock.

Following a de-assertion of the lost clock state, as indicated by a lost clock signal on a lost_clock path (403), a logic circuit (430) may delay the pass transistor circuit (402) from selectively connecting the voltage potential on the voltage_input path (401) and the output of the pass transistor circuit (405) by a fixed time duration. After the fixed time duration has occurred, the pass transistor circuit (402) selectively connects the voltage potential on the voltage_input path (401) and the output of the pass transistor circuit (405). Accordingly, the DLL (300 shown in FIG. 3) may maintain a desired voltage potential on the capacitor (206 shown in FIG. 3) until the phase-detector (202 shown in FIG. 3) and the charge pump (204 shown in FIG. 3) resume a desired operating condition.

The fixed time duration may be dependent on counting a specific number of clock cycles following the de-assertion of the lost clock state. Accordingly, the clock signal (423) may be input to the logic circuit (430). Contrastingly, the fixed time duration may be determined by another clock circuit, for example, a ring oscillator. Also, the fixed time duration may be determined by a temporal delay circuit, for example, a resistor and capacitor delay circuit. Other circuits may be used to determine the fixed time duration. Accordingly, the clock signal (423) may not be necessary for proper operation of the logic circuit (430).

Figure 5:
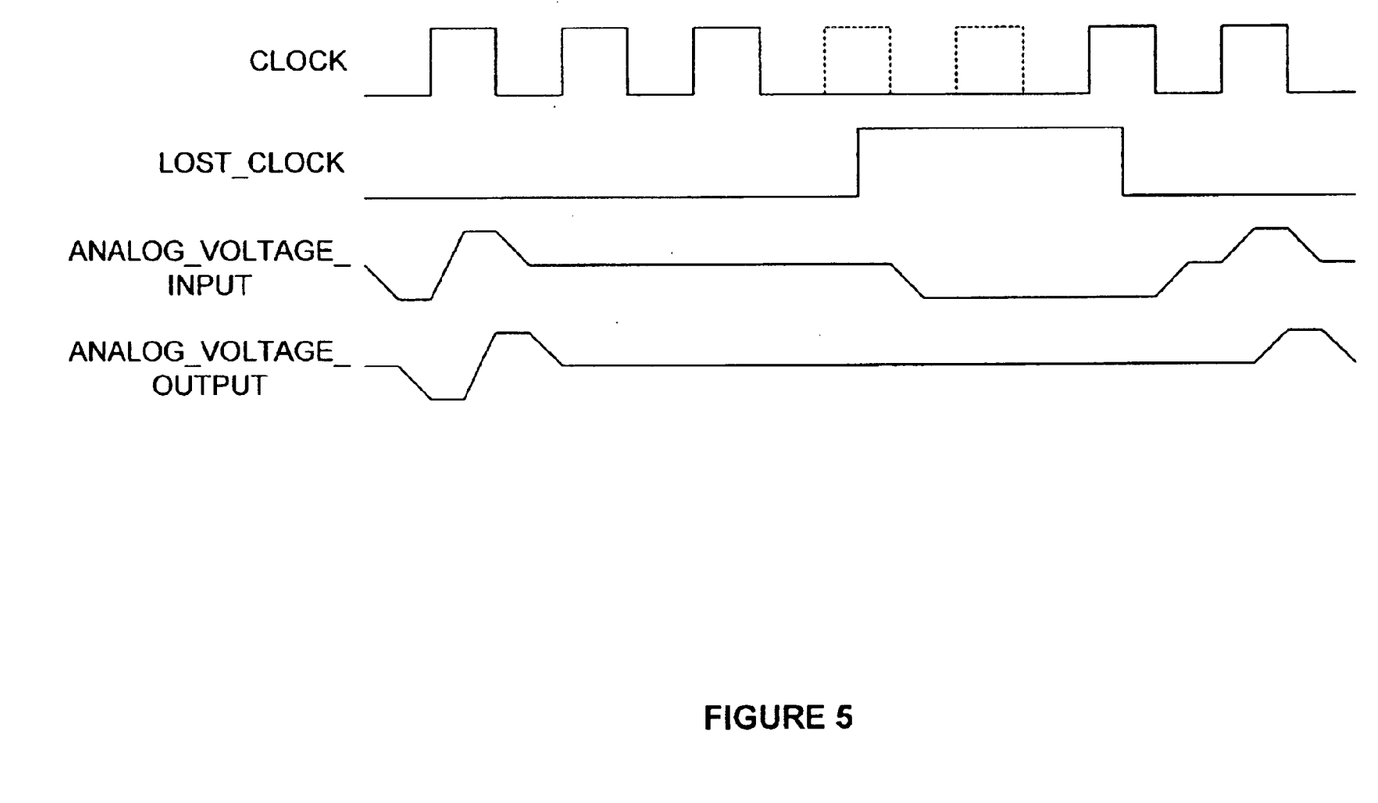
FIG. 5 shows an exemplary timing diagram in accordance with the embodiment shown in FIG. 4.

FIG. 5 shows an exemplary timing diagram of the analog state storage apparatus (400) shown in FIG. 4. When the clock signal (CLOCK) (423) is active, the lost clock signal (LOST_CLOCK) (403) is de-asserted. While the lost clock signal (423) is de-asserted, the output of the analog state storage apparatus (400) mirrors the input of the analog state storage apparatus (400) with some delay.

However, when a lost clock state occurs as indicated by the lost dashed clock signal pulses in FIG. 5, the lost clock signal (403) is asserted. In response to the assertion of the lost clock signal (403), as described above with reference to FIG. 4, the analog state storage apparatus (400) outputs dependent on a voltage stored before the occurrence of the lost clock state. Thus, the analog state storage apparatus (400) provides a usable output voltage during the lost clock state.

One of ordinary skill in the art having benefit of this disclosure will understand that one or more analog state storage apparatus may be operatively connected to a DLL at a variety of different locations. For example, the analog state storage apparatus (400) may be connected to the bias signals (209, 211) output from the bias generator (208) in FIG. 3. The one or more analog state storage apparatus are used to reduce or remove a required relock time when a DLL recovers from a lost clock state. Furthermore, depending on the length of time a DLL is in a lost clock state, the analog state storage apparatus (400) may have additional circuitry to maintain a consistent voltage potential stored on the capacitor $C_0$ (404). Also, the amplifier (406) may be designed to overdrive a voltage potential generated and/or attempted to be altered by the DLL. Accordingly, the voltage potential stored on the capacitor $C_0$ (404) is appropriately represented to ensure proper operation of the DLL.

Advantages of the present invention may include one or more of the following. In one or more embodiments, because a DLL is operatively connected to an analog state storage apparatus, the DLL may require little or no time to recover from a lost clock state.

In one or more embodiments, because an analog state storage apparatus includes an amplifier, the analog state storage apparatus may overdrive a voltage in a DLL. Advantageously, a stored voltage in the analog state storage apparatus is used by the DLL. As a result, the DLL may require little or no time to recover from a lost clock state.

In one or more embodiments, because an analog state storage apparatus is operatively connected to a DLL, the DLL may be used in a system that intermittently transmits a clock.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. An integrated circuit, comprising:
   a clock path arranged to carry a clock signal;
   a power supply path arranged to receive power from a power supply;
   a delay locked loop operatively connected to the power supply path and the clock path, wherein the delay locked loop is arranged to generate a voltage potential dependent on a phase difference between the clock signal and a delayed clock signal output of the delay locked loop; and
   an analog state storage apparatus operatively connected to the delay locked loop, wherein the analog state storage apparatus is arranged to store the voltage potential, and wherein the analog state storage apparatus is arranged to output the stored voltage potential to the delay locked loop in response to a loss of at least one of the clock signal and the delayed clock signal.

2. The integrated circuit of claim 1, wherein the analog state storage apparatus is arranged to receive a signal indicative of the loss of at least one of the clock signal and the delayed clock signal.

3. An integrated circuit, comprising:

a clock path arranged to carry a clock signal;

a power supply path arranged to receive power from a power supply;

a delay locked loop operatively connected to the power supply path and the clock path, wherein the delay locked loop is arranged to generate a voltage potential dependent on a phase difference between the clock signal and a delayed clock signal output of the delay locked loop; and an analog state storage apparatus operatively connected to the delay locked loop, wherein the analog state storage apparatus is arranged to store the voltage potential, and wherein the analog state storage apparatus is arranged to output the stored voltage potential to the delay locked loop in response to a loss of at least one of the clock signal and the delayed clock signal, wherein the analog state storage apparatus comprises a pass transistor circuit and a capacitor.

4. The integrated circuit of claim 3, wherein the capacitor is arranged to store the stored voltage potential.

5. The integrated circuit of claim 3, wherein the pass transistor circuit comprises a switch arranged to control current flow between the voltage potential and an output of the pass transistor circuit.

6. The integrated circuit of claim 3, wherein the analog state storage apparatus further comprises a unity gain amplifier.

7. An integrated circuit, comprising:

a clock path arranged to carry a clock signal;

a power supply path arranged to receive power from a power supply;

a delay locked loop operatively connected to the power supply path and the clock path, wherein the delay locked loop is arranged to generate a voltage potential dependent on a phase difference between the clock signal and a delayed clock signal output of the delay locked loop; and an analog state storage apparatus operatively connected to the delay locked loop, wherein the analog state storage apparatus is arranged to store the voltage potential, and wherein the analog state storage apparatus is arranged to output the stored voltage potential to the delay locked loop in response to a loss of at least one of the clock signal and the delayed clock signal, wherein the delay locked loop comprises a charge pump operatively connected to a filter capacitor, and wherein the stored voltage potential is dependent on the charge pump and the filter capacitor.

8. The integrated circuit of claim 7, wherein an output of the charge pump is operatively disabled dependent on a signal indicative of the loss of at least one of the clock signal and the delayed clock signal.

9. The integrated circuit of claim 7, wherein the analog state storage apparatus is arranged to operatively drive the filter capacitor to recover from the loss of at least one of the clock signal and the delayed clock signal.

10. The integrated circuit of claim 1, wherein the analog state storage apparatus is arranged to selectively not receive the voltage potential for a fixed time duration.

11. A method for controlling a delay locked loop, comprising:

generating a delayed clock signal;

comparing the delayed clock signal to an input clock signal;

generating a voltage potential dependent on the comparing;

storing the voltage potential; and operatively using the stored voltage potential to generate the delayed clock signal in response to a loss of at least one of the input clock signal and the delayed clock signal.

12. The method of claim 11, further comprising:

selectively disconnecting the generated voltage potential from the stored voltage potential in response to the loss of at least one of the input clock signal and the delayed clock signal.

13. The method of claim 12, wherein the selectively disconnecting comprises selectively propagating the generated voltage potential to the stored voltage potential.

14. The method of claim 11, further comprising:

buffering the stored voltage potential.

15. A method for controlling a delay locked loop, comprising:

generating a delayed clock signal;

comparing the delayed clock signal to an input clock signal;

generating a voltage potential dependent on the comparing;

storing the voltage potential; and operatively using the stored voltage potential to generate the delayed clock signal in response to a loss of at least one of the input clock signal and the delayed clock signal, buffering the stored voltage potential, wherein the buffering uses a unity gain amplifier.

16. A method for controlling a delay locked loop, comprising:

generating a delayed clock signal;

comparing the delayed clock signal to an input clock signal;

generating a voltage potential dependent on the comparing;

storing the voltage potential; and operatively using the stored voltage potential to generate the delayed clock signal in response to a loss of at least one of the input clock signal and the delayed clock signal, wherein the storing uses a capacitor.

17. The method of claim 11, further comprising:

selectively disabling the generating the voltage potential in response to the loss of at least one of the input clock signal and the delayed clock signal.

18. The method of claim 11, further comprising:

selectively disconnecting the generated voltage potential from the stored voltage potential for a fixed time duration.

19. An integrated circuit, comprising:

means for generating a delayed clock signal;

means for comparing the delayed clock signal to an input clock signal;
means for generating a voltage potential dependent on the means for comparing;
means for storing the voltage potential; and
means for selectively disconnecting the generated voltage potential from the stored voltage potential in response to a loss of at least one of the input clock signal and the delayed clock signal.

20. The integrated circuit of claim 19, further comprising:

means for buffering the stored voltage potential.

21. The integrated circuit of claim 19, further comprising:

means for selectively disabling the generating the voltage potential in response to at least one selected from the loss of at least one of the input clock signal and the delayed clock signal, and a fixed time duration.

22. The integrated circuit of claim 19, further comprising:

means for indicating the loss of at least one of the clock signal and the delayed clock signal.

* * * * *